(12) United States Patent
Levinski et al.

(10) Patent No.: US 11,101,153 B2
(45) Date of Patent: Aug. 24, 2021

(54) PARAMETER-STABLE MISREGISTRATION MEASUREMENT AMELIORATION IN SEMICONDUCTOR DEVICES

(71) Applicant: KLA CORPORATION, Milpitas, CA (US)

(72) Inventors: Vladimir Levinski, Migdal Ha'emek (IL); Yuri Paskover, Binyamina (IL); Sharon Aharon, Hanaton (IL); Amnon Manassen, Haifa (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/496,918

(22) PCT Filed: Aug. 23, 2019

(86) PCT No.: PCT/US2019/047797
§ 371 (c)(1),
(2) Date: Sep. 23, 2019

(87) PCT Pub. No.: WO2020/190318
PCT Pub. Date: Sep. 24, 2020

(65) Prior Publication Data
US 2021/0020480 A1   Jan. 21, 2021

Related U.S. Application Data

(60) Provisional application No. 62/821,596, filed on Mar. 21, 2019.

(51) Int. Cl.
*H01L 21/67* (2006.01)
*G03F 7/20* (2006.01)
(Continued)

(52) U.S. Cl.
CPC ....... *H01L 21/67259* (2013.01); *G01N 21/21* (2013.01); *G01N 21/47* (2013.01);
(Continued)

(58) Field of Classification Search
None
See application file for complete search history.

(56) References Cited

U.S. PATENT DOCUMENTS 6,064,486 A *  5/2000  Chen ......................... G03F 9/70
                                                          356/399
7,102,749 B2   9/2006  Bareket
(Continued)

FOREIGN PATENT DOCUMENTS

KR    101281301 B1   3/2013
KR    101749440 B1   6/2017

OTHER PUBLICATIONS

IPO, ISR for PCT/US2019/047797, dated Dec. 20, 2019.

*Primary Examiner* — Shawn Decenzo
(74) *Attorney, Agent, or Firm* — Hodgson Russ LLP

(57) ABSTRACT

A parameter-stable misregistration measurement amelioration system and method including providing a wafer, including a plurality of multilayered semiconductor devices formed thereon, selected from a batch wafers intended to be identical, using a misregistration metrology tool to measure misregistration at multiple sites between at least a first layer and a second layer of the wafer, using a plurality of sets of measurement parameters, thereby generating measured misregistration data for each of the sets of measurement parameters, identifying and removing a parameter-dependent portion and a mean error portion from the measured misregistration data for the wafer for each of the sets of measurement parameters, thereby generating ameliorated parameter-stable ameliorated misregistration data for the wafer.

20 Claims, 2 Drawing Sheets

(51) Int. Cl.
    *H01L 21/66*     (2006.01)
    *G01N 21/21*     (2006.01)
    *G01N 21/47*     (2006.01)
    *G01N 21/95*     (2006.01)
    *H01L 23/544*     (2006.01)

(52) U.S. Cl.
    CPC ..... *G01N 21/9501* (2013.01); *G03F 7/70633* (2013.01); *H01L 22/12* (2013.01); *H01L 23/544* (2013.01); *H01L 2924/00* (2013.01)

(56) References Cited

U.S. PATENT DOCUMENTS

| | | | | |
|---|---|---|---|---|
| 2009/0063378 | A1* | 3/2009 | Izikson | H01L 22/12 706/21 |
| 2013/0096876 | A1 | 4/2013 | Cohen et al. | |
| 2014/0249768 | A1* | 9/2014 | Vagos | G06F 17/00 702/104 |
| 2015/0042984 | A1* | 2/2015 | Pandev | G03F 9/7026 356/124 |
| 2015/0316490 | A1* | 11/2015 | Amit | G01N 21/47 356/400 |

\* cited by examiner

PARAMETER-STABLE MISREGISTRATION MEASUREMENT AMELIORATION IN SEMICONDUCTOR DEVICES

REFERENCE TO RELATED APPLICATIONS

Reference is hereby made to U.S. Provisional Patent Application Ser. No. 62/821,596, filed Mar. 21, 2019 and entitled DYNAMIC ACCURACY OPTIMIZATION BASED ON OVERLAY ERROR VARIATION WITH MEASUREMENT CONDITIONS, the disclosure of which is hereby incorporated by reference and priority of which is hereby claimed.

FIELD OF THE INVENTION

The present invention relates measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide an improved methods and systems for measurement of misregistration in the manufacture of semiconductor devices.

There is thus provided in accordance with a preferred embodiment of the present invention a parameter-stable misregistration measurement amelioration method including providing a wafer, including a plurality of multilayered semiconductor devices formed thereon, selected from a batch wafers intended to be identical, using a misregistration metrology tool to measure misregistration at multiple sites between at least a first layer and a second layer of the wafer, using a plurality of sets of measurement parameters, thereby generating measured misregistration data for each of the sets of measurement parameters, identifying and removing a parameter-dependent portion and a mean error portion from the measured misregistration data for the wafer for each of the sets of measurement parameters, thereby generating ameliorated parameter-stable ameliorated misregistration data for the wafer.

In accordance with a preferred embodiment of the present invention, the sets of measurement parameters comprise at least multiple wavelengths of light used in misregistration measurement.

Preferably, the identifying the parameter-dependent portion and the mean error portion includes identifying a parameter-dependent portion for the measured misregistration data for each of the sets of measurement parameters, identifying at least one principal component of the parameter-dependent portion of the misregistration data for each of the sets of measurement parameters, identifying a weighting coefficient for the at least one principal component of the parameter-dependent portion of the measured misregistration data for each of the sets of parameters and identifying at least one mean error portion, each of the mean error portions corresponding to each of the at least one principal components of the parameter-dependent portion of the measured misregistration data for each of the sets of measurement parameters.

In accordance with a preferred embodiment of the present invention the parameter-stable misregistration measurement amelioration method also includes using the parameter-dependent portion and the mean error portion to identify and remove a parameter-dependent portion and a mean error portion from measured misregistration data for at least one additional wafer selected from the batch wafers intended to be identical, for each of the sets of measurement parameters, thereby generating ameliorated parameter-stable ameliorated misregistration data for the at least one additional wafer.

In accordance with a preferred embodiment of the present invention, the misregistration metrology tool is an imaging misregistration metrology tool. Alternatively, in accordance with a preferred embodiment of the present invention, the misregistration metrology tool is a scatterometry misregistration metrology tool.

Preferably, the at least one principal component of the parameter-dependent portion of the misregistration data for each of the sets of measurement parameters is identified using principal component analysis.

In accordance with a preferred embodiment of the present invention, the mean error portions are identified using a reference misregistration value. Preferably, the reference misregistration value is generated by using a reference misregistration metrology tool to measure the wafer. Preferably, the reference misregistration tool is an electron beam misregistration metrology tool.

Alternatively, in accordance with a preferred embodiment of the present invention, the mean error portions are identified using a statistical model. Preferably, the statistical model is compiled from multiple misregistration measurements of the wafer. Preferably, the statistical model includes a modeled portion and an unmodeled portion.

In accordance with a preferred embodiment of the present invention, the sets of measurement parameters comprise at least one of a focus variability in misregistration measurement, a numerical aperture used in misregistration measurement, an angle of incidence of light used in misregistration measurement and a polarization of light used in misregistration measurement.

There is also provided in accordance with another preferred embodiment of the present invention a parameter-stable misregistration measurement amelioration system including a misregistration metrology tool operative to measure misregistration at multiple sites between at least a first layer and a second layer of a wafer, including a plurality of multilayered semiconductor devices formed thereon, selected from a batch of wafers intended to be identical, using a plurality of sets of measurement parameters, thereby generating measured misregistration data for each of the parameters and a misregistration data analyzer operative to identify and remove a parameter-dependent portion and a mean error portion from the measured misregistration data for the wafer for each of the sets of measurement parameters, thereby generating ameliorated parameter-stable ameliorated misregistration data for the wafer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
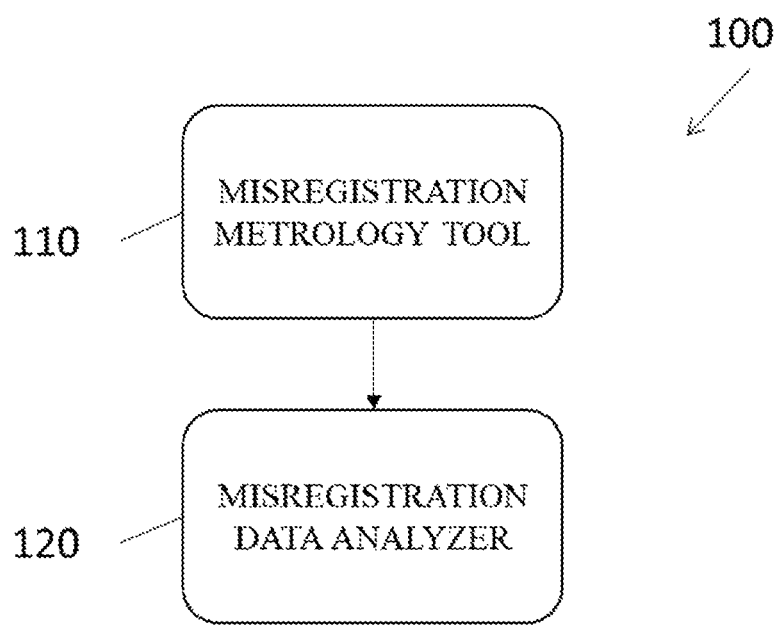
FIG. 1 is a simplified schematic illustration of a parameter-stable misregistration measurement amelioration system.
Figure 2:
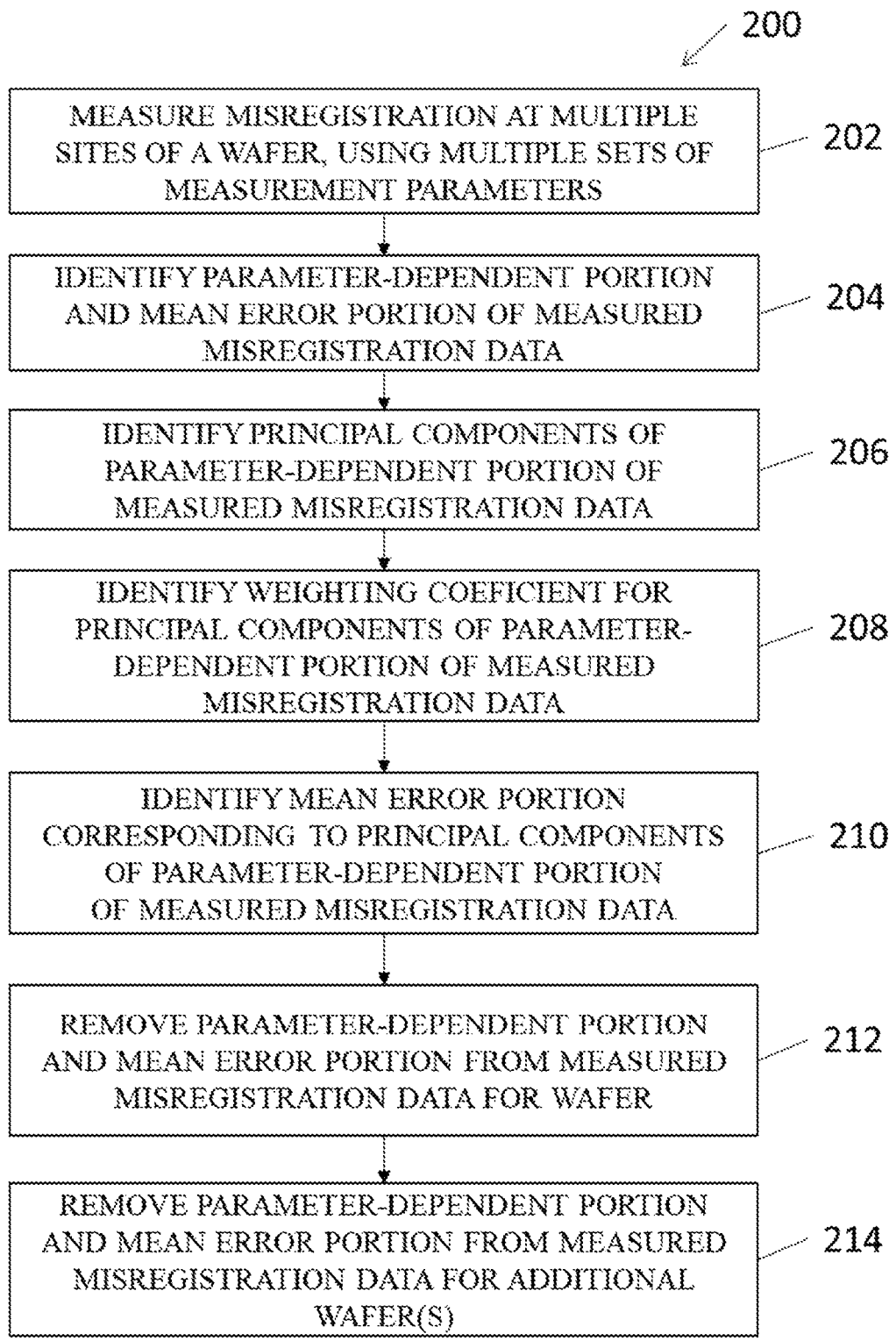
FIG. 2 is a simplified flow chart illustrating a parameter-stable misregistration measurement amelioration method useful by the parameter-stable misregistration measurement amelioration system of FIG. 1.

It is appreciated that the system and method described hereinbelow with reference to FIGS. 1 & 2 form part of a manufacturing process for semiconductor devices, and the misregistration measured by the system and method described hereinbelow with reference to FIGS. 1 & 2 is used to adjust fabrication processes of the semiconductor devices to more closely align various layers of the semiconductor devices being fabricated.

Reference is now made to FIG. 1, which is a simplified schematic illustration of a parameter-stable misregistration measurement amelioration system (PSMMAS) 100, and to FIG. 2, which is a simplified flow chart illustrating a parameter-stable misregistration measurement amelioration method (PSMMAM) 200 useful by PSMMAS 100.

As seen in FIG. 1, PSMMAS 100 includes a misregistration metrology tool 110 and a misregistration data analyzer 120. Misregistration metrology tool 110 can be any suitable misregistration metrology tool, having the capability to measure misregistration using a plurality of sets of measurement parameters, such as an imaging misregistration metrology tool or a scatterometry misregistration metrology tool. Preferably, the parameters include multiple wavelengths of light used in measuring misregistration. A typical imaging misregistration metrology tool forming part of PSMMAS 100 is an Archer™ 700, commercially available from KLA Corporation, of Milpitas, Calif. A typical scatterometry misregistration metrology tool forming part of PSMMAS 100 is an ATL100™, commercially available from KLA Corporation, of Milpitas, Calif.

As seen in FIG. 2, at a first step 202, a wafer, including a plurality of multilayered semiconductor devices formed thereon, selected from a batch of wafers intended to be identical, is provided, and misregistration metrology tool 110 measures misregistration, also referred to as overlay, at multiple sites, s, between at least a first layer and a second layer of the wafer, using multiple sets of measurement parameters, $\lambda$, preferably including multiple wavelengths of light, thereby generating measured misregistration data, $OVL(\lambda,s)$, for each site and for each of the sets of parameters. It is appreciated that each of the wafers in the batch of wafers intended to be identical undergo the same fabrication steps and include semiconductor devices intended to be identical to corresponding semiconductor devices on all other wafers in the batch of wafers intended to be identical.

Typically, the wafer measured at step 202 includes features having some number, n, of deformations included in each of the measured sites. Thus, measured misregistration data, $OVL(\lambda,s)$, may include components from both a misregistration between the first and second layers $OVL_0(s)$, as well as components from each deformation eigenvector $\epsilon_k(\lambda,s)$, as described in equation 1:

$$OVL(\lambda,s)=OVL_0(s)+\Sigma_{k=1}^{n}\alpha_k(s)\epsilon_k(\lambda,s) \qquad \text{(Eq. 1)}$$

where k is an index indicating a deformation and $\alpha_k(s)$ is a weighting coefficient for each deformation eigenvector $\epsilon_k(\lambda,s)$. It is noted that unlike the misregistration of the wafer $OVL_0(s)$, the terms from each deformation eigenvector $\epsilon_k(\lambda,s)$ are dependent on a parameter, such as wavelength of light, used in the misregistration measurement. It is further noted that each deformation eigenvector $\epsilon_k(\lambda,s)$ includes terms from both a parameter-dependent portion $\epsilon_k(\lambda,s)$ and a mean error portion $\mu_k(s)$, as seen in equation 2:

$$\epsilon_k(\lambda,s)=\epsilon_k(\lambda,S)+\mu_k(S) \qquad \text{(Eq. 2)}$$

It is noted that both the parameter-dependent portion $\epsilon_k(\lambda,s)$ and the mean error portion $\mu_k(s)$ result from the same $k^{th}$ deformation. Therefore, both the parameter-dependent portion $\epsilon_k(\lambda,s)$ and the mean error portion $\mu_k(s)$ are proportional to an amplitude of the $k^{th}$ deformation, and thus the parameter-dependent portion $\epsilon_k(\lambda,s)$ and the mean error portion $\mu_k(s)$ are mathematically related to each other.

In order to solve equations 1 and 2, and thus identify misregistration between the first and second layers, $OVL_0(s)$, PSMMAM 200 proceeds to solve additional equations, as described hereinbelow with further reference to FIGS. 2A & 2B.

At a next step 204, as seen in equation 3, misregistration data analyzer 120 identifies a parameter-dependent portion $OVL_\epsilon(\lambda,s)$ for each site, s, and for each parameter set, $\lambda$, of measured misregistration data $OVL(\lambda,s)$ and a mean error portion $OVL_\mu(s)$ for each site s of measured misregistration data $OVL(\lambda,s)$ generated at step 202.

$$OVL(\lambda,s)=OVL_\epsilon(\lambda,s)+OVL_\mu(s) \qquad \text{(Eq. 3)}$$

It is noted that in equation 3, mean error portion $OVL_\mu(s)$ includes both the misregistration of the wafer $OVL_0(s)$ and a mean error portion associated with the measured misregistration data $OVL(\lambda,s)$.

At a next step 206, misregistration data analyzer 120 uses principal component analysis (PCA) for a set of parameter-dependent portions $\{OVL_\epsilon(\lambda,s)\}$ of measured misregistration data $OVL(\lambda,s)$ to identify a set of principal components $\{\epsilon_k(\lambda,s)\}$ corresponding to the n deformations included in each of the sites, s, measured at step 202.

At a next step 208, misregistration data analyzer 120 identifies a suitable weighting coefficient $\alpha_k(s)$ for equation 1 by identifying a value of weighting coefficient $\alpha_k(s)$ that minimizes a metric $M_1$, as defined in equation 4:

$$M_1=\Sigma_\lambda[OVL_\epsilon(\lambda,s)-\Sigma_{k=1}^{n}\alpha_k(s)\epsilon_k(\lambda,s)]^2 \qquad \text{(Eq. 4)}$$

It is noted that for an orthonormal set of principal components $\{\epsilon_k(\lambda,s)\}$, equation 4 represents the projections of $\{OVL_\epsilon(\lambda,s)\}$ onto $\{\epsilon_k(\lambda,s)\}$.

At a next step 210, misregistration data analyzer 120 identifies mean error portions $\mu_k$ corresponding to each one of the principle components $\epsilon_k(\lambda,s)$ identified at step 206 for each measured site, s. In a preferred embodiment of the present invention, mean error portions $\mu_k(s)$ are identified using equation 5:

$$OVL_R(s)=OVL_\mu(s)-\Sigma_k\alpha_k(s)\mu_k(S) \qquad \text{(Eq. 5)}$$

where $OVL_R(s)$ is a reference misregistration value for each site of the wafer measured at step 202, and PSMMAM 200 identifies mean error portions $\mu_k(s)$ which result in the best matching between the left-hand-side and the right-hand-side of equation 5 for all sites, s, measured at step 202.

Preferably, reference misregistration $OVL_R(s)$ is generated by using a reference misregistration metrology tool to measure misregistration of the wafer measured at step 202. A typical reference misregistration metrology tool is an electron beam misregistration metrology tool, such as an eDR7xxx™, commercially available from KLA Corporation of Milpitas, Calif., USA. Other suitable reference misregistration metrology tools include, inter alia, optical tools, SEM tools, TEM tools and AFM tools.

In an alternative embodiment of the present invention, a statistical model is compiled from multiple, preferably at least 200, misregistration measurements of the wafer measured at step 202. Typically, each of the misregistration measurements includes a modeled portion, corresponding to actual device misregistration, and an unmodeled portion, corresponding to deformations. Mean error portions $\mu_k(s)$ are identified by identifying values of mean error portions $\mu_k(s)$ that minimize a metric $M_2$, as defined in equation 6:

$$M_2 = \Sigma_s [OVL_\mu(S) - \Sigma_k \alpha_k|_U(s)\mu_k(s)]^2 \quad \text{(Eq. 6)}$$

where $OVL_\mu|_U(s)$ is the unmodeled portion of the mean error portion of the misregistration of each site included in the statistical model and $\alpha_k|_U(s)$ is the unmodeled portion of the weighting coefficients $\alpha_k(s)$.

At a next step 212, misregistration data analyzer 120 removes the parameter-dependent portion $\varepsilon_k(\lambda,s)$ and the mean error portion $\mu_k(s)$ from the measured misregistration data $OVL(\lambda,s)$ generated at step 202 for the wafer for each of the parameters used in misregistration measurements, thereby generating ameliorated parameter-stable ameliorated misregistration data $OVL_O(s)$ for the wafer.

In a preferred embodiment of the present invention, parameter-stable ameliorated misregistration data $OVL_O(s)$ is used to adjust at least one tool used in the fabrication of the batch of wafers intended to be identical from which the wafer measured in step 202 was selected.

Preferably, at a next step 214, at least one additional wafer, including a plurality of multilayered semiconductor devices, selected from the batch of wafers intended to be identical from which a wafer was provided at step 202, is provided. As part of step 214, misregistration metrology tool 110 measures misregistration at multiple sites between at least a first layer and a second layer of the wafer, using a plurality of sets of measurement parameters sets, thereby generating measured misregistration data for each of the parameter sets. Preferably, the parameter sets include multiple wavelengths of light.

Then, misregistration data analyzer 120 uses parameter-dependent portion $OVL_\varepsilon(\lambda,s)$ for the at least one additional measured at step 214 to define the weighting coefficients $\alpha_k(s)$ for the at least one additional wafer. Once weighting coefficients $\alpha_k(s)$ for the at least one additional wafer are known, misregistration data analyzer 120 uses the one or more deformation eigenvectors $\epsilon_k(\lambda,s)$ identified at step 210 to identify and remove the parameter-dependent portion $\varepsilon_k(\lambda,s)$ and the mean error portion $\mu_k(s)$ from the measured misregistration data $OVL(\lambda,s)$ generated at step 214 for the at least one additional wafer for each of the parameter sets, thereby generating ameliorated parameter-stable ameliorated misregistration data $OVL_O(s)$ for the one or more additional wafers. It is appreciated that the one or more deformation eigenvectors $\epsilon_k(\lambda,s)$ identified at step 210 include a parameter-dependent portion $\varepsilon_k(\lambda,s)$, and a mean error portion $\mu_k(s)$, as described hereinabove with reference to Eq. 2.

In an alternative embodiment of the present invention, at step 202, the sets of measurement parameters used by misregistration metrology tool 110 include at least one of a focus variability in misregistration measurement, a numerical aperture used in misregistration measurement, an angle of incidence of light used in misregistration measurement and a polarization of light used in misregistration measurement. In such an embodiment, variations in misregistration measurement data as a function of the varied at least one misregistration measurement parameter are preferably analyzed in a similar manner to the analysis described hereinabove with reference to FIG. 2, thereby generating ameliorated parameter-stable ameliorated misregistration data.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A parameter-stable misregistration measurement amelioration method comprising:
    providing a wafer, comprising a plurality of multilayered semiconductor devices formed thereon, selected from a batch of wafers intended to be identical;
    using a misregistration metrology tool to measure misregistration at multiple sites between at least a first layer and a second layer of said wafer, using a plurality of sets of measurement parameters, thereby generating measured misregistration data for each of said sets of measurement parameters; and
    identifying and removing a parameter-dependent portion and a mean error portion from said measured misregistration data for said wafer for each of said sets of measurement parameters, thereby generating ameliorated parameter-stable ameliorated misregistration data for said wafer.

2. The parameter-stable misregistration measurement amelioration method of claim 1, wherein said sets of measurement parameters comprise at least multiple wavelengths of light used in misregistration measurement.

3. The parameter-stable misregistration measurement amelioration method of claim 1, wherein said identifying said parameter-dependent portion and said mean error portion comprises:
    identifying a parameter-dependent portion for said measured misregistration data for each of said sets of measurement parameters;
    identifying at least one principal component of said parameter-dependent portion of said misregistration data for each of said sets of measurement parameters;
    identifying a weighting coefficient for said at least one principal component of said parameter-dependent portion of said measured misregistration data for each of said sets of parameters; and
    identifying at least one mean error portion, each of said mean error portions corresponding to each of said at least one principal component of said parameter-dependent portion of said measured misregistration data for each of said sets of measurement parameters.

4. The parameter-stable misregistration measurement amelioration method of claim 3, wherein said at least one principal component of said parameter-dependent portion of said misregistration data for each of said sets of measurement parameters is identified using principal component analysis.

5. The parameter-stable misregistration measurement amelioration method of claim 1, further comprising using said parameter-dependent portion and said mean error portion to identify and remove a parameter-dependent portion and a mean error portion from measured misregistration data for at least one additional wafer selected from said batch of wafers intended to be identical, for each of said sets of measurement parameters, thereby generating ameliorated parameter-stable ameliorated misregistration data for said at least one additional wafer.

6. The parameter-stable misregistration measurement amelioration method of claim 1, wherein said misregistration metrology tool is an imaging misregistration metrology tool or a scatterometry misregistration metrology tool.

7. The parameter-stable misregistration measurement amelioration method of claim 1, wherein said mean error portions are identified using a reference misregistration value.

8. The parameter-stable misregistration measurement amelioration method of claim 7, wherein said reference misregistration value is generated by using a reference misregistration metrology tool to measure said wafer.

9. The parameter-stable misregistration measurement amelioration method of claim 8, wherein said reference misregistration tool is an electron beam misregistration metrology tool.

10. The parameter-stable misregistration measurement amelioration method of claim 1, wherein said sets of measurement parameters comprise at least one of:
 a focus variability in misregistration measurement;
 a numerical aperture used in misregistration measurement;
 an angle of incidence of light used in misregistration measurement; or
 a polarization of light used in misregistration measurement.

11. A parameter-stable misregistration measurement amelioration system comprising:
 a misregistration metrology tool operative to measure misregistration at multiple sites between at least a first layer and a second layer of a wafer, comprising a plurality of multilayered semiconductor devices formed thereon, selected from a batch of wafers intended to be identical, using a plurality of sets of measurement parameters, thereby generating measured misregistration data for each of said parameters; and
 a misregistration data analyzer operative to:
  identify and remove a parameter-dependent portion and a mean error portion from said measured misregistration data for said wafer for each of said sets of measurement parameters, thereby generating ameliorated parameter-stable ameliorated misregistration data for said wafer.

12. The parameter-stable misregistration measurement amelioration system of claim 11, wherein said sets of measurement parameters comprise at least multiple wavelengths of light used in misregistration measurement.

13. The parameter-stable misregistration measurement amelioration system of claim 11, wherein said misregistration data analyzer is further operative to:
 identify a parameter-dependent portion for said measured misregistration data for each of said sets of measurement parameters;
 identify at least one principal component of said parameter-dependent portion of said misregistration data for each of said sets of measurement parameters;
 identify a weighting coefficient for said at least one principal component of said parameter-dependent portion for said measured misregistration data for each of said sets of measurement parameters; and
 identify at least one mean error portion, each of said at least one mean error portion corresponding to each of said at least one principal components of said parameter-dependent portion of said measured misregistration data for each of said sets of measurement parameters.

14. The parameter-stable misregistration measurement amelioration system of claim 13, wherein said at least one principal component of said parameter-dependent portion of said misregistration data for each of said sets of measurement parameters is identified using principal component analysis.

15. The parameter-stable misregistration measurement amelioration system of claim 11, wherein said analyzer is further operative to use said parameter-dependent portion and said mean error portion to identify and remove a parameter-dependent portion and a mean error portion from said measured misregistration data for at least one additional wafer selected from said batch of wafers intended to be identical, for each of said sets of measurement parameters, thereby generating ameliorated parameter-stable ameliorated misregistration data for said at least one additional wafer.

16. The parameter-stable misregistration measurement amelioration system of claim 11, wherein said misregistration metrology tool is an imaging misregistration metrology tool or a scatterometry misregistration metrology tool.

17. The parameter-stable misregistration measurement amelioration system of claim 11, wherein said mean error portions are identified using a reference misregistration value.

18. The parameter-stable misregistration measurement amelioration system of claim 17, wherein said reference misregistration value is generated by using a reference misregistration metrology tool to measure said wafer.

19. The parameter-stable misregistration measurement amelioration system of claim 18, wherein said reference misregistration tool is an electron beam misregistration metrology tool.

20. The parameter-stable misregistration measurement amelioration system of claim 11, wherein said sets of measurement parameters comprise at least one of:
 a focus variability in misregistration measurement;
 a numerical aperture used in misregistration measurement;
 an angle of incidence of light used in misregistration measurement; or
 a polarization of light used in misregistration measurement.

* * * * *